United States Patent [19]

Obermann

[11] Patent Number: 4,635,584
[45] Date of Patent: Jan. 13, 1987

[54] APPARATUS FOR TINNING PRINTED-CIRCUIT BOARDS

[76] Inventor: Klaus Obermann, Bruder-Grimm-Strasse 2d, D-6107 Reinheim-Ueberau, Fed. Rep. of Germany

[21] Appl. No.: 755,325

[22] PCT Filed: Oct. 29, 1984

[86] PCT No.: PCT/EP84/00341
§ 371 Date: Jun. 28, 1985
§ 102(e) Date: Jun. 28, 1985

[87] PCT Pub. No.: WO85/01963
PCT Pub. Date: May 9, 1985

[30] Foreign Application Priority Data
Nov. 4, 1983 [DE] Fed. Rep. of Germany ....... 3339887

[51] Int. Cl.⁴ .................. B05C 11/00; B05C 3/10
[52] U.S. Cl. ................................. 118/64; 118/429; 228/20
[58] Field of Search ............... 118/403, 429, 64, 425; 228/20

[56] References Cited

U.S. PATENT DOCUMENTS

| 20,673 | 3/1938 | Meyers | 118/620 |
| 3,865,298 | 2/1975 | Allen et al. | 228/20 |
| 4,315,042 | 2/1982 | Spigarelli | 228/20 X |

FOREIGN PATENT DOCUMENTS 167262 8/1921 United Kingdom.

*Primary Examiner*—Evan K. Lawrence

[57] ABSTRACT

A treatment tank (14) for the tinning of printed-circuit boards with a continuous interior chamber (22) has a bottom tank portion (16) joined to a wider upper tank portion (20) by sloping wall sections (18). The heatable bottom tank portion (16) is filled with molten solder (24) over whose surface in the upper tank portion (20) a highly heatable thermofor oil heated approximately at the temperature of the molten solder is poured. Under the surface of the thermofor oil, in the upper tank portion there are disposed two spaced apart jet-nozzle tubes (32) with nozzles (34) aimed toward one another and inclined slightly downwardly from which thermofor oil delivered by a pump (38) can be squirted onto a printed-circuit board (12) drawn upwardly between the jet-nozzle tubes (32) after immersion into the molten solder.

12 Claims, 1 Drawing Figure

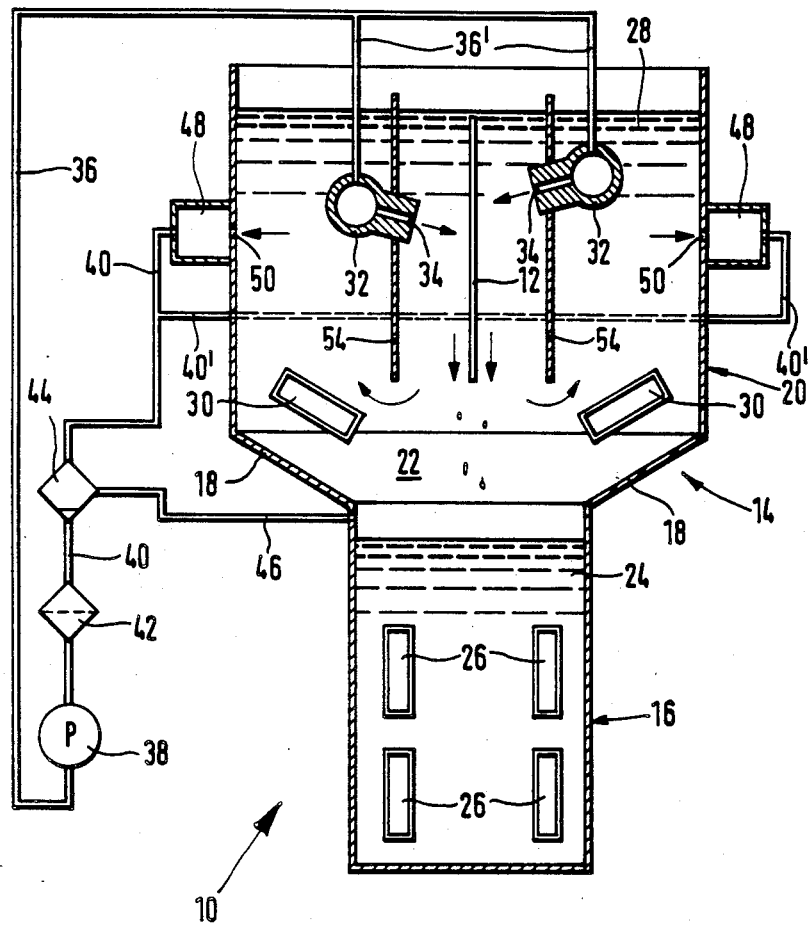

APPARATUS FOR TINNING PRINTED-CIRCUIT BOARDS

The invention relates to an apparatus for tinning printed-circuit boards by immersion in a heatable vessel filled with molten solder, with an additional heatable vessel for a thermofor oil capable of being heated to a high temperature in which a squirting means in the form of two jet-nozzle tubes spaced apart from one another and equipped with opposed nozzles are provided, from which thermofor oil aspirated by a pump from the vessel can be squirted against the opposite flat sides of printed-circuit boards previously dipped into the solder vessel.

The selective tinning of printed circuit boards is performed by dipping the circuit boards, masked in accordance with the tin coating to be applied, into a bath of molten lead-tin solder after previously dipping them in a flux and preheating them. The circuit board removed again from the molten solder must be freed of adhering excess solder especially in solder trapped in the holes in the circuit boards, and the finally tinned areas of the circuit board are to bear a thin, uniform tinning without any unsightly irregularities along edges, at eyelets and on larger surface areas. To accomplish this, a variety of methods have been developed for treating the tinned circuit boards after their removal from the solder bath, e.g., by blowing heated air against them and, recently, immersing them into a bath of water-soluble thermofor oil heated at about 235° C., while moving them within the bath between slotted nozzle tubes from which thermofor oil aspirated by a pump from the tank is squirted against the circuit board surfaces, thus flushing away excess solder, even out of the holes in the circuit board. The flushed-away solder gathers, due to its greater specific weight, on the bottom of the tank, whence it is pumped back by means of a special pump into the container holding the molten solder. Although this method achieves technically faultless results, the surface of the tinning can show textural signs of the lead-tin flux and may have unsightly irregularities at the edges and eyelets and also on larger surface areas, which may be attributable to the fact, among others, that, when the circuit boards are removed from the molten solder, a thin oxide skin can form on the tinning as a result of the possible access of atmospheric oxygen before the board is passed between the slotted-nozzle tubes.

It is consequently the object of the invention to create an apparatus for tinning printed-circuit boards, in which the after-treatment of the boards dipped into the molten solder is performed also by squirting heated thermofor oil against them, but in which the tinning finally obtained has a perfect appearance. Moreover, the apparatus is to have a simpler construction than the known apparatus.

Setting out from an apparatus of the kind mentioned in the beginning, this object is achieved in accordance with the invention in that the tank containing the thermofor oil and the solder tank are portions of a common treatment tank having a continuous interior in which the part filled with the specifically lighter, heated thermofor oil is situated above the tank portion filled with the specifically heavier molten solder, so that the circuit boards to be tinned pass, before and after they are dipped into the solder, through the thermofor overlying the solder. The circuit boards, therefore, after their removal from the solder bath, enter directly into the thermofor oil bath and thus pass between the jet-nozzle tubes, so that no intermediate cooling takes place and no atmospheric oxygen can reach them, resulting in the obtaining of a perfectly bright and uniform appearance of the tinned surfaces. The excess solder squirted away by the jet-nozzle tubes is returned due to its greater specific weight immediately into the molten solder situated in the bottom portion of the tank, so that the use of a special pump for returning the solder to the solder tank is unnecessary.

In order to keep the amount of the solder as low as possible, yet sufficiently deep to permit the complete immersion of the circuit boards, the bottom, solder-filled portion of the treatment tank, as seen at right angles to the flat sides of the circuit boards to be introduced into it, is narrower than the tank portion filled with the thermofor oil.

The upper tank portion filled with thermofor oil is made to merge with lower wall sections sloping funnel-like into the narrower bottom, solder-filled portion of the treatment tank, so as to assure that solder flushed away from the circuit boards in the upper container portion will be returned to the melt if these particles, due to the conditions of flow in the thermofor oil, are at first laterally deflected from a position above the solder bath. These solder particles then sink, after the flow quiets, onto the sloping wall sections and are guided back by them into the bottom portion of the tank.

The jet-nozzle tubes are preferably disposed in the upper area of the upper tank portion below the surface of the thermofor oil, one on either side of the path of introduction of the circuit boards for tinning, with the nozzles aimed against one another and slightly downwardly. The jets of thermofor oil striking the circuit boards thus are given a downwardly directed component of flow whereby the flushed-away tinning material (solder) is returned into the tank part that is filled with the molten solder.

The jet-nozzle tubes are preferably at different heights in the upper portion of the tank, in order that the time-staggered action of the jets as the circuit board passes between the jet-nozzle tubes will drive the solder trapped in the holes in the circuit board out of the holes.

In a preferred further development of the invention, the jet-nozzle tubes are disposed in the upper tank part for adjustment with regard to their distance from one another and/or to the angle of aim of the nozzles so that the action of the jets can be adapted to various requirements as regards the circuit board thickness and/or to solder baths of various composition.

The jet-nozzle tubes can be provided either with one slotted nozzle each, or they are, preferably, equipped with a plurality of separate individual nozzles disposed successively lengthwise of the tube, the distance between adjacent nozzles being then to be chosen such that the emerging jets of thermofor oil will overlap at the distance of the circuit boards to be introduced between them.

To avoid the occurrence in the thermofor oil of undesired turbulence keeping the smaller particles of the flushed away tinning material (solder) suspended and, in the most unfavorable case, putting it back onto the already flushed circuit board surface, vertical baffle plates are disposed parallel and at a distance from one another in the upper portion of the tank, on either side of the path of introduction of the circuit boards.

The level of the solder in the lower portion of the tank can be controlled by a simple float system (not shown), the precise level being readable, for example, on a scale which is fastened to the top of the float riding on the solder and extends out of the treatment tank. Any refilling with solder that may become necessary is performed simply by pouring the solder, which is best in powder or granulated form, into the treatment tank.

The suction line of the pump delivering the thermofor oil to the jet-nozzle tubes is best connected to drainways which are disposed on the outside of the wall of the upper portion of the tank and communicate with the interior of the tank through a plurality of openings. If these drainways and the openings are made with a sufficiently large cross section, turbulence of the thermofor oil in the suction area is prevented, and therefore also the entrainment of molten solder droplets.

Furthermore, it may be desirable to provide in the suction conduit to the pump a filter and/or a separator—e.g., a centrifugal separator—for solder particles or other impurities entrained in the thermofor oil.

Lastly, the flushing action of the thermofor oil jets emerging from the jet-nozzle tubes can be promoted by an ultrasound system having at least one ultrasonic radiation source disposed in the upper part of the tank.

The invention is further explained in the following description of an embodiment in conjunction with the single FIGURE of the drawing which shows a cross section through an apparatus constructed in the manner of the invention for tinning printed-circuit boards.

The apparatus in accordance with the invention, represented in the FIGURE and designated as a whole by the number 10, for tinning printed-circuit boards 12, has a treatment tank 14 which can be charged from the top, and which is composed of a narrower bottom tank portion 16 and an upper tank portion 20 placed on sloping wall sections 18, these portions forming a single chamber 22. The bottom container portion 16 is filled with lead-tin solder 24 as tinning material, which can be heated by electrical resistance heating elements 26 to a temperature (ranging from 220° to 250° C.) in which it is molten. By a thermostat control, not shown, of the heating elements 26, the temperature of the molten solder is held at the required level. The chamber above the molten solder bath 24 is largely filled with a water-soluble thermofor oil 28 which can be greatly heated and which does not boil or degrade at the temperature of the molten solder bath 24, and which can be heated, preferably again by resistance heating elements 30 which can be controlled in energy input by a thermostat control (not shown) at a temperature above the melting temperature of the tinning material (solder).

In the upper part of the tank portion 20, two horizontally disposed jet-nozzle tubes 32 are disposed at a distance from one another and at slightly different levels, whose nozzles 34, constructed either as elongated slotted nozzles or as a row of a plurality of individual nozzles arranged successively lengthwise of the tube, are aimed toward one another and inclined slightly downwardly from the tube interior into the chamber 22. The jet-nozzle tubes 32 are connected by discharge conduits 36, 36', to the discharge connection of a pump 38 which is connected on the suction side by conduits 40, 40', to the upper tank portion 20. In the illustrated case, there is inserted into the conduit 40 a filter 42 for the removal of impurities, and a separator 44 for the separation of any solder that may still be contained in the aspirated thermofor oil and can be returned from the separator 44 to the molten solder 24 through a return conduit 46.

The suction conduits 40, 40', are not carried directly into the upper tank portion 20, but into drainways 48 which are formed by channels welded onto the outside of the upper tank portion 20 and are connected to the chamber 22 by a plurality of openings 50 in the tank wall. As a result of their distribution and of the relatively large total cross section of the openings 50, the velocity of flow of the thermofor oil passing from the tank into the drainways is low and thus free of turbulence, thereby preventing any undesired entrainment of solder particles flushed from the circuit board 12 into the pumping circuit.

The same purpose is served by the disposal of two vertical baffles 54 which are disposed parallel at a distance from one another on both sides of the path of the introduction of the circuit board 12 for tinning. This prevents the formation of a circulatory flow at first deflected downwardly by the circuit board being tinned, then upwardly from the surface of the molten solder bath 24 and along the sloping walls 18 in the outer part of the tank portion 20, in which solder particles might again be entrained and pass over into the drainways 48 or back onto the already flushed portions of a circuit board 12.

It is apparent that modifications and further developments of the described embodiment can be made within the scope of the invention. For example, the jet-nozzle tubes 32 can be made variable as regards their distance from one another and from the circuit board passing between them, and as regards the nozzle aperture angle. The same applies also to the baffles 54, which can be made variable in regard to their distance from one another and can be in a position other than the perpendicular in the tank portion 20. In any case it is desirable for the baffles to extend all the way to or to a point just above the surface of the thermofor oil in order to prevent the formation of a circulation completed through the jet-nozzle tubes.

I claim:

1. An apparatus for tinning printed-circuit boards, comprising: a first heatable tank portion for molten solder, a second heatable tank portion for thermofor oil, a pump for aspirating thermofor oil from the second tank portion, squirting means including two jet-nozzle tubes with nozzles aimed against one another for squirting thermofor oil aspirated by said pump against opposite flat sides of printed-circuit boards after immersion into the solder, the first and second tank portions being portions of a common treatment tank with a continuous chamber in which the second tank portion lies above the first tank portion, whereby before and after immersion, the circuit boards to be tinned pass into the solder through the thermofor oil bath, the first tank portion seen at right angles to the opposite flat sides of the circuit boards to be immersed being narrower than the second tank portion, and the second tank portion having a bottom portion merging funnel-wise with the first tank portion.

2. An apparatus according to claim 1, wherein the jet-nozzle tubes are disposed in an upper part of the second tank portion underneath the surface of thermofor oil, the nozzle tubes having outlets aimed slightly downwardly.

3. An apparatus according to claim 2, wherein the jet-nozzle tubes are disposed at different levels from one another.

4. An apparatus according to claim 3, wherein the distance of the jet-nozzle tubes from each other and the nozzle outlet angles are adjustable.

5. An apparatus according to claim 1, wherein each jet-nozzle tube has at least one slot nozzle.

6. An apparatus according to claim 1, wherein each jet-nozzle tube has a plurality of separate individual nozzles disposed successively in the tube length direction, the spacing between adjacent nozzles being such that emerging jets of thermofor oil overlap one another.

7. An apparatus according to claim 1, comprising vertical baffles disposed in the second tank portion on both sides of the path of the printed-circuit boards, at a parallel distance from one another.

8. An apparatus according to claim 1, comprising a float system for controlling the level of solder in the first tank portion.

9. An apparatus according to claim 1, comprising a suction conduit for the pump, and drainways connected to the suction conduit and disposed outside the second tank portion and joined to the tank interior through a plurality of openings.

10. An apparatus according to claim 9, comprising a filter in the suction conduit for solder particles entrained in the thermofor oil.

11. An apparatus according to claim 9, comprising a separator in the suction conduit for solder particles entrained in the thermofor oil.

12. An apparatus according to claim 1, comprising an ultrasound device having at least one ultrasound radiation source disposed in the second tank portion.

* * * * *